(12) United States Patent
Matsumoto

(10) Patent No.: US 7,129,137 B2
(45) Date of Patent: Oct. 31, 2006

(54) METHOD OF MANUFACTURING SEMICONDUCTOR DEVICE HAVING MULTIPLE GATE OXIDE FILMS

(75) Inventor: Hiroki Matsumoto, Kanagawa (JP)

(73) Assignee: NEC Corporation, Kanagawa (JP)

( * ) Notice: Subject to any disclaimer, the term of this patent is extended or adjusted under 35 U.S.C. 154(b) by 0 days.

(21) Appl. No.: 11/138,481

(22) Filed: May 27, 2005

(65) Prior Publication Data

US 2005/0266644 A1 Dec. 1, 2005

(30) Foreign Application Priority Data

May 31, 2004 (JP) ............................. 2004-161083

(51) Int. Cl.
*H01L 21/8234* (2006.01)
(52) U.S. Cl. ...................... 438/275; 438/279; 438/283; 438/294
(58) Field of Classification Search ......... 438/275–307
See application file for complete search history.

(56) References Cited

U.S. PATENT DOCUMENTS 6,482,698 B1 * 11/2002 Peschiaroli et al. ......... 438/257

2002/0119616 A1 * 8/2002 Baldi et al. .................. 438/238

FOREIGN PATENT DOCUMENTS

JP 6-196639 A 7/1994

* cited by examiner

*Primary Examiner*—H. Jey Tsai
(74) *Attorney, Agent, or Firm*—iLighrue Mion, PLLC

(57) ABSTRACT

A method of manufacturing a semiconductor device includes forming a first insulating film having a first thickness in a first region on a semiconductor substrate, forming a first gate electrode on the first insulating film, and forming a second insulating film having a second thickness different from the first thickness on the semiconductor substrate and the first gate electrode. Then, the method includes forming a conductive film on the second oxide film and forming a first resist pattern and a second resist pattern respectively on the conductive film in the first region and on the conductive film of a second region different from the first region. Then, the method includes removing the conductive film by using the first resist pattern as a mask to form a second gate electrode covering the first gate electrode via the second insulating film and removing the conductive film by using the second resist pattern as a mask to form a third gate electrode on the second insulating film of the second region.

10 Claims, 9 Drawing Sheets

METHOD OF MANUFACTURING SEMICONDUCTOR DEVICE HAVING MULTIPLE GATE OXIDE FILMS

BACKGROUND OF THE INVENTION

1. Field of the Invention

The present invention relates to a method of manufacturing a semiconductor device and, particularly, to a method of manufacturing a semiconductor device having multiple gate oxide films.

2. Description of a Related Art

In an IC, such as a PDP (plasma display panel) driver and an LCD (liquid crystal display) driver, a semiconductor in which transistors having different threshold voltages are mounted in a mixed manner on the same substrate may sometimes be used. Such a semiconductor device is provided with, for example, two transistors, i.e., a transistor having a relatively low threshold voltage (hereinafter referred to as "a low-voltage transistor)" and a transistor having a relatively high threshold voltage (hereinafter referred to as "a high-voltage transistor.)" In manufacturing such a semiconductor device, it is necessary to form a thin gate oxide film for a low-voltage transistor and a thick gate oxide film for a high-voltage transistor. Such multiple gate oxide films having different film thicknesses are hereinafter referred to as "multiple gate oxide films." A semiconductor device having multiple gate oxide films is hereinafter referred to "a multigate semiconductor device."

FIG. 1A to FIG. 1I are each a sectional view that shows a conventional process for manufacturing a multigate semiconductor device. In FIG. 1A to FIG. 1I, an element region in which a low-voltage transistor is formed is denoted by the reference character "L" and an element region in which a high-voltage transistor is formed is denoted by the reference character "H."

First, a field oxide film 31 is formed on a semiconductor substrate 30 by a selected oxidation process (LOCOS: local oxidation of silicon), whereby element isolation is performed. Subsequently, a dummy oxide film 32 is formed on the whole surface, and a nitride film 33 is formed on this dummy oxide film 32. As a result of this, the structure shown in FIG. 1A is obtained.

Next, by performing the patterning of a photoresist, a pattern 34 having an opening in a region in which a gate electrode of a high-voltage transistor (an electrode formation region) is formed on the nitride film 33. Subsequently, by performing dry etching in which this pattern 34 is used as a mask, the nitride film 33 and the dummy oxide film 32 in the above-described electrode formation region are removed. As a result of this, the structure shown in FIG. 1B is obtained.

Next, the pattern 34 is removed. Subsequently, by a selective oxidation method in which the nitride film 33 is used as a mask, a gate oxide film 35 of a high-voltage transistor is formed in the above-described electrode formation region. In this step of selective oxidation, a thin oxide film 36 is formed on the nitride film 33. As a result of this, the structure shown in FIG. 1C is obtained.

Next, the oxide film 36 and the nitride film 33 are removed by performing wet etching. On that occasion, also the surface of the gate oxide film 35 of a high-voltage transistor is subjected to wet etching treatment. Furthermore, the dummy oxide film 32 is removed by performing wet etching, and the surface of the semiconductor substrate 30 in the element region L of a low-voltage transistor is exposed. Also on that occasion, the surface of the gate oxide film 35 of a high-voltage transistor is subjected to wet etching treatment. As a result of this, the structure shown in FIG. 1D is obtained.

Next, as shown in FIG. 1E, a gate oxide film 37 for a low-voltage transistor is formed on the semiconductor substrate 30.

Next, polycrystalline silicon 38 is formed on the whole surface. Subsequently, by performing the patterning of a photoresist, a pattern 39 and a pattern 40 are formed respectively on the electrode formation region of a low-voltage transistor and the electrode formation region of a high-voltage transistor. As a result of this, the structure shown in FIG. 1F is obtained.

Next, by performing dry etching in which these patterns 39, 40 are used as masks, the above-described polycrystalline silicon 38 is selectively removed. After that, the patterns 39, 40 are removed. As a result of this, as shown in FIG. 1G, a gate electrode 41 of a low-voltage transistor and a gate electrode 42 of a high-voltage transistor are formed.

Next, as shown in FIG. 1H, by performing impurity ion implantation in which the above-described gate electrodes 41, 42 are used as masks, an LDD (lightly doped drain) is formed in the semiconductor substrate 30. Subsequently, impurity ions are implanted in source-drain regions of the low-voltage transistor and high-voltage transistor. Source-drains of the low-voltage transistor and high-voltage transistor are formed by causing the impurities to diffuse thermally.

Next, the gate oxide film 37 is removed by using the above-described electrodes 41, 42 as masks. In this way, as shown in FIG. 1I, a multigate semiconductor device in which a low-voltage MOS transistor and a high-voltage MOS transistor are mounted in a mixed manner on the same substrate is completed.

According to the above-described manufacturing method, the surface of the gate oxide film 35 of a high-voltage transistor is subjected to wet etching treatment while the semiconductor device is being worked from the condition shown in FIG. 1C to the condition shown in FIG. 1D. For this reason, the film quality of the gate oxide film 35 deteriorates, posing the problem that the reliability of the gate oxide film 35 of a high-voltage transistor decreases.

The Japanese Patent Laid-Open No. 6-196639 discloses another process for manufacturing a multigate semiconductor device. FIG. 2A to FIG. 2H are each a sectional view that shows the manufacturing process disclosed in the Japanese Patent Laid-Open No. 6-196639. In FIG. 2A to FIG. 2H, an element region in which a low-voltage transistor is formed is denoted by the reference character "L" and an element region in which a high-voltage transistor is formed is denoted by the reference character "H."

First, a field oxide film 51 is formed on a semiconductor substrate 50 by a selected oxidation process, whereby element isolation is performed. Subsequently, a dummy oxide film 52 is formed on the whole surface. After that, by performing the patterning of a photoresist, a pattern 53 having an opening in a source-drain region of a high-voltage transistor is formed. As a result of this, the structure shown in FIG. 2A is obtained. And by performing impurity ion implantation in which this pattern 53 is used as a mask, an LDD is formed in the semiconductor substrate 50. After the removal of the pattern 53, a pattern (not shown) having an opening in a channel region of a high-voltage transistor is formed. And by using this pattern as a mask, channel ions are implanted in the semiconductor substrate 50 through the dummy oxide film 52. After that, the pattern is removed.

Next, a nitride film 54 is formed on the whole surface. Subsequently, by performing the patterning of a photoresist, a pattern 55 having an opening in an electrode formation region of a high-voltage transistor is formed on the nitride film 54. Furthermore, by performing dry etching in which this pattern 55 is used as a mask, the nitride film 54 and the dummy oxide film 52 in the electrode formation region are removed. As a result of this, the structure shown in FIG. 2B is obtained.

Next, after the removal of the pattern 55, by a selective oxidation process in which the nitride film 54 is used as a mask, a gate oxide film 56 of a high-voltage transistor is formed in the above-described electrode formation region. In this step of selective oxidation, a thin oxide film 57 is formed on the nitride film 54. Subsequently, polycrystalline silicon 58 is formed on the whole surface. And by performing the patterning of a photoresist, a pattern 59 is formed in the electrode formation region of a high-voltage transistor. As a result of this, the structure shown in FIG. 2C is obtained.

Next, by performing dry etching in which this pattern 59 is used as a mask, the above-described polycrystalline silicon 58 is selectively removed. After that, the pattern 59 is removed. As a result of this, as shown in FIG. 2D, a gate electrode 60 of a high-voltage transistor is formed.

Next, the oxide film 57 is removed by performing wet etching, and furthermore the nitride film 54 is removed by performing dry etching. Subsequently, a pattern 61 which covers an element region H of a high-voltage transistor is formed. As a result of this, the structure shown in FIG. 2E is obtained. And using the pattern 61 as a mask, channel ions are implanted through the dummy oxide film 52 into the semiconductor substrate 50 in an element region L.

Next, the pattern 61 is removed and the dummy oxide film 52 is removed by performing wet etching. As a result of this, the structure shown in FIG. 2F is obtained.

Next, a gate oxide film 62 for a low-voltage transistor is formed on the whole surface. Subsequently, polycrystalline silicon 63 is formed on the gate oxide film 62. Furthermore, by performing the patterning of a photoresist, a pattern 64 is formed in an electrode formation region of a low-voltage transistor. As a result of this, the structure shown in FIG. 2G is obtained.

Next, by performing dry etching in which the pattern 64 is used as a mask, the above-described polycrystalline silicon 63 is selectively removed. As a result of this, as shown in FIG. 2H, a gate electrode 65 of a low-voltage transistor is formed.

Next, the above-described LDD portion of a high-voltage transistor is covered with a prescribed pattern (not shown), and impurity ions are implanted in source-drain regions of the low-voltage transistor and high-voltage transistor. Sources-drains of the low-voltage transistor and high-voltage transistor are formed by causing the impurities to diffuse thermally. And the gate oxide film 62 is removed by using the above-described electrodes 65, 60 as masks. In this way, a multigate semiconductor device in which a low-voltage MOS transistor and a high-voltage MOS transistor are mounted in a mixed manner on the same substrate is completed.

According to the manufacturing method disclosed in the Japanese Patent Laid-Open No. 6-196639, after the formation of the gate oxide film 56 of a high-voltage transistor, the polycrystalline silicon 58, is subsequently formed (see FIG. 2C). In the succeeding steps, the exposure of the surface of the gate oxide film 56 of a high-voltage transistor does not occur, and it might be thought that the film quality of the gate oxide film 56 does not deteriorate due to etching.

Also, according to the manufacturing method disclosed in the Japanese Patent Laid-Open No. 6-196639, in order to form the gate electrode 65 of a low-voltage transistor, the polycrystalline silicon 63 is selectively removed by performing dry etching in which the pattern 64 is used as a mask (see FIGS. 2G and 2H). On that occasion, the polycrystalline silicon 63 which covers the gate electrode 60 of a high-voltage transistor is also removed. However, it might be thought that the structure after this removal step is in actuality the structure shown in FIG. 3, and not the structure shown in FIG. 2H. That is, the polycrystalline silicon 63 on the side surface of, the gate electrode 60 of a high-voltage transistor is not completely removed, and that as shown in FIG. 3, the polycrystalline silicon 63 which has not been removed remains as residual polycrystalline silicon on the side surface of the gate electrode 60. When this residue polycrystalline silicon 66 exfoliates, it becomes scrap, causing the worsening of yield.

SUMMARY OF THE INVENTION

A method of manufacturing a semiconductor device includes:

forming a first insulating film having a first thickness in a first region on a semiconductor substrate;

forming a first gate electrode on the first insulating film;

forming a second insulating film having a second thickness different from the first thickness on the semiconductor substrate and the first gate electrode;

forming a conductive film on the second oxide film;

forming a first resist pattern and a second resist pattern respectively on the conductive film in the first region and on the conductive film of a second region different from the first region;

removing the conductive film by using the first resist pattern as a mask to form a second gate electrode covering the first gate electrode via the second insulating film; and removing the conductive film by using the second resist pattern as a mask to form a third gate electrode on the second insulating film of the second region.

According to the above method, the film quality of multiple gate oxide films is improved. Moreover, this method can improve its yields because there is no residue which easy separate from the second insulating film on the first gate electrode.

BRIEF DESCRIPTION OF THE DRAWINGS

The above and other objects as well as advantages of the present invention will become clear by the following description of the preferred embodiments of the present invention with reference to the accompanying drawings, wherein.

DETAILED DESCRIPTION OF THE PREFERRED EMBODIMENTS

Figure 1A:
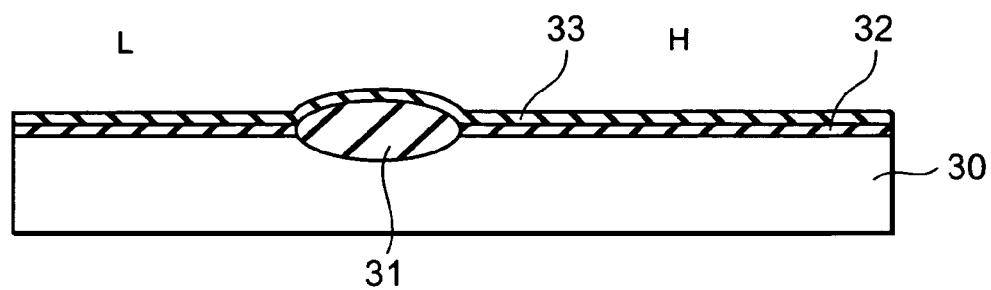
FIGS. 1A to 1I are cross sectional views each showing a method of manufacturing a first related multigate semiconductor device.
Figure 1B:
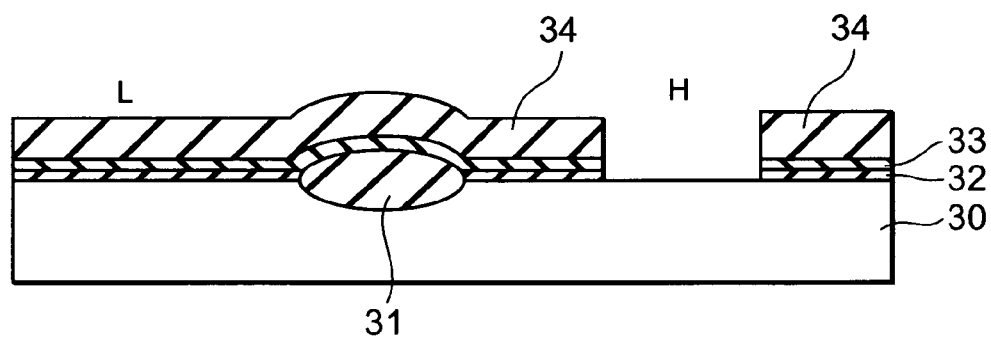
Figure 1C:
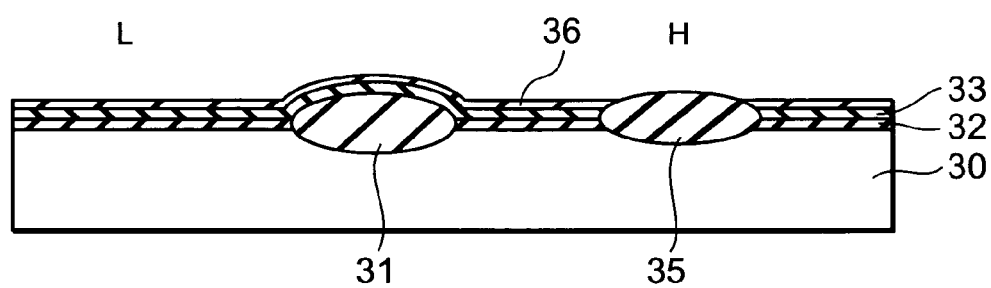
Figure 1D:
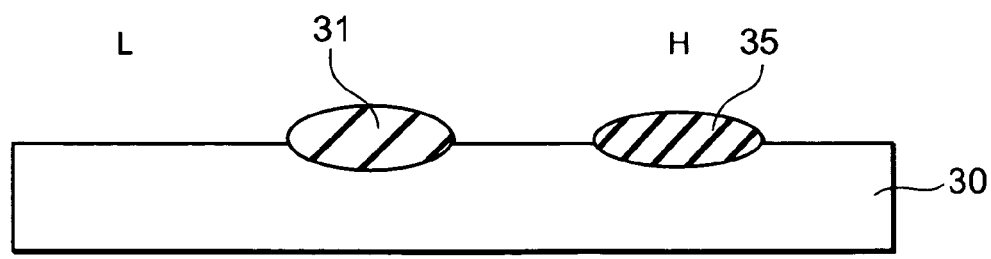
Figure 1E:
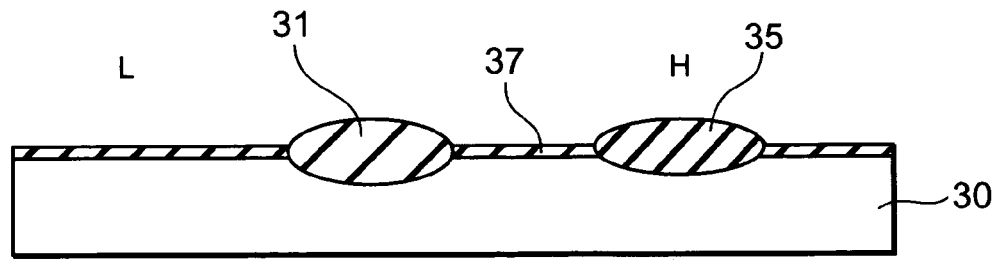
Figure 1F:
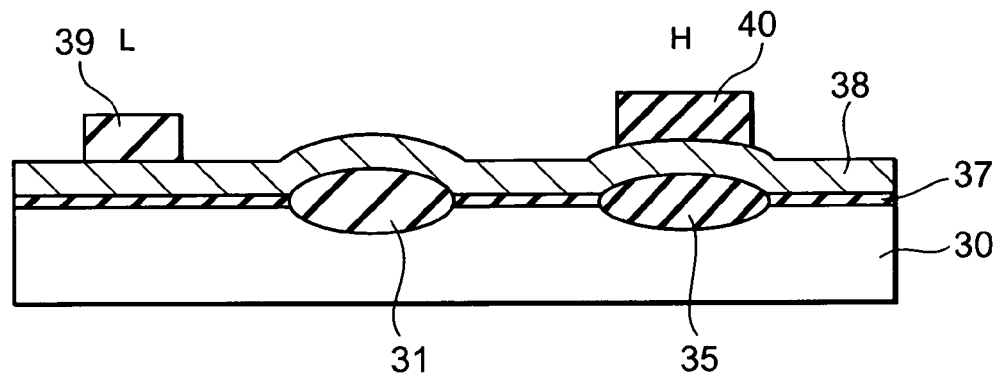
Figure 1G:
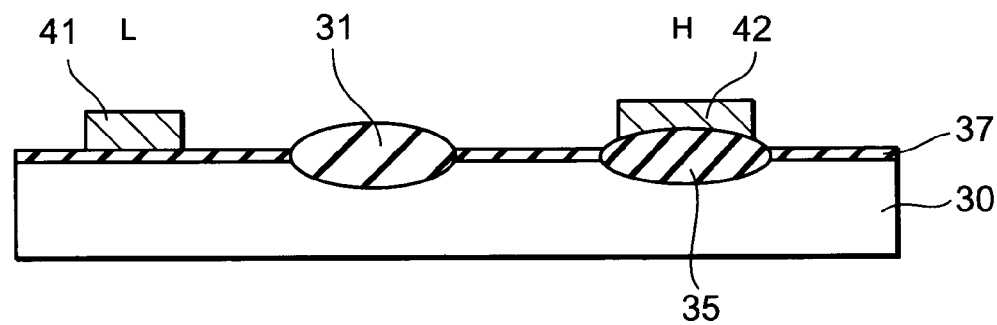
Figure 1H:
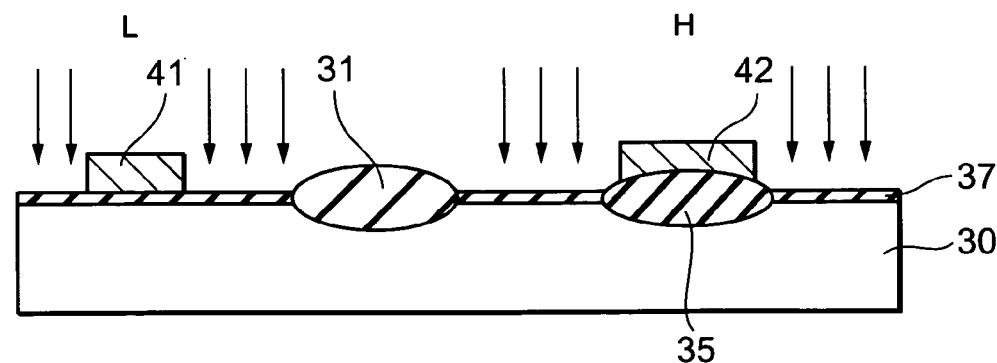
Figure 1I:
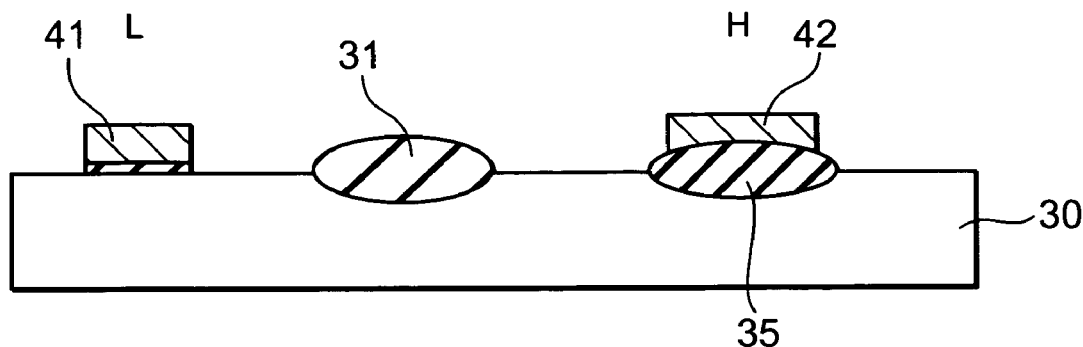
Figure 2A:
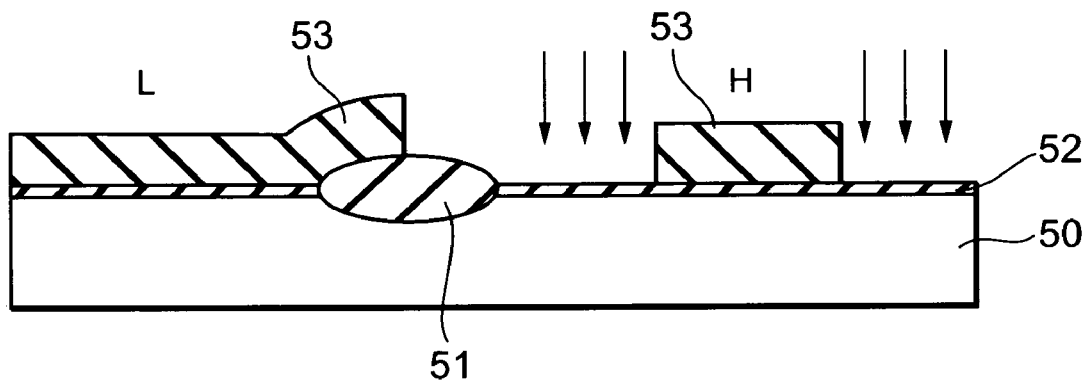
FIGS. 2A to 2H are cross sectional views each showing a method of manufacturing a first related multigate semiconductor device.
Figure 2B:
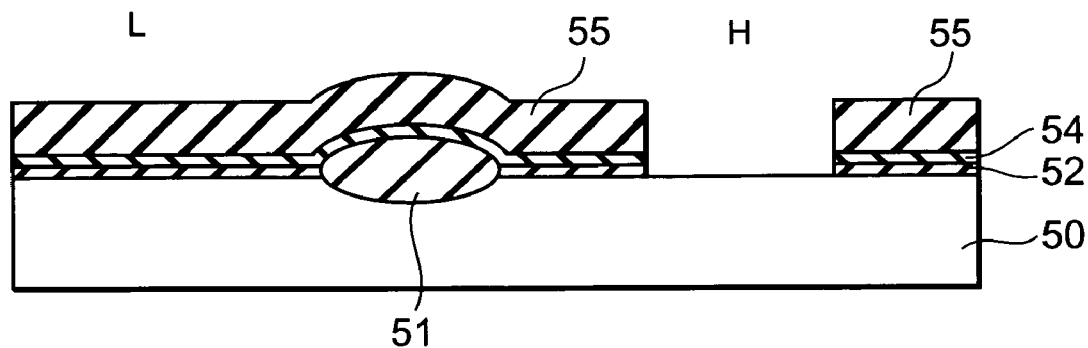
Figure 2C:
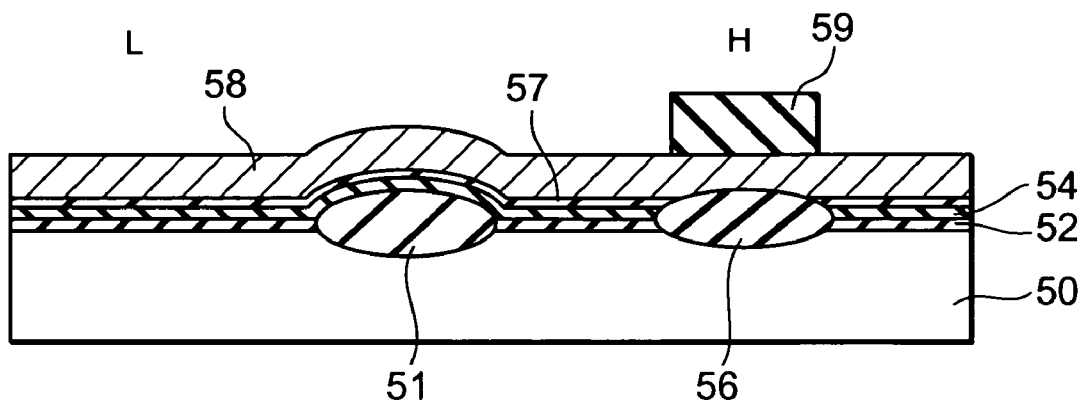
Figure 2D:
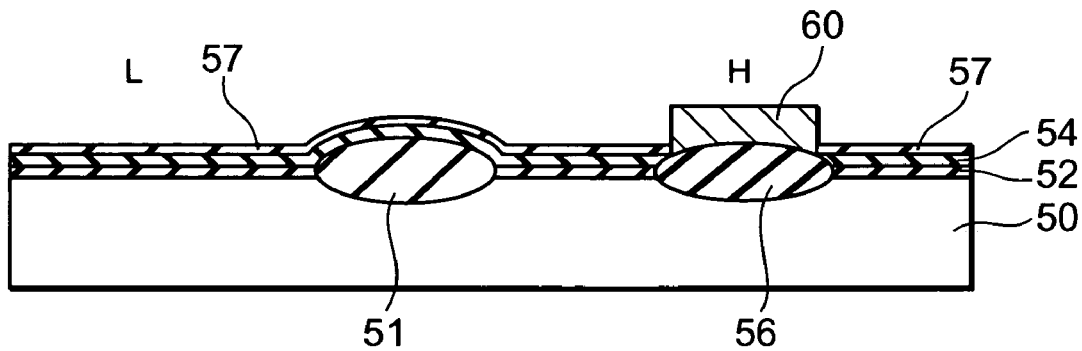
Figure 2E:
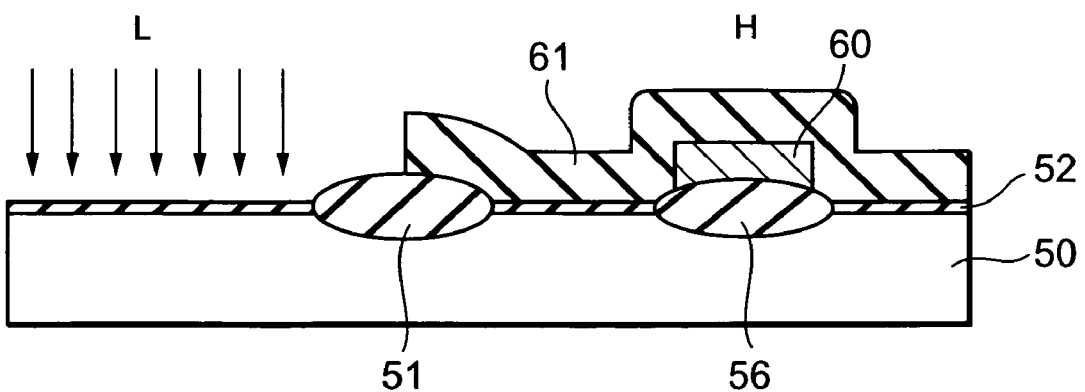
Figure 2F:
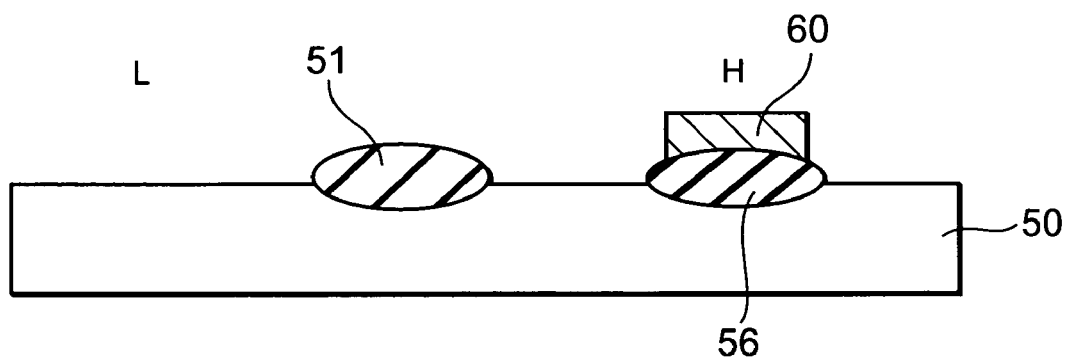
Figure 2G:
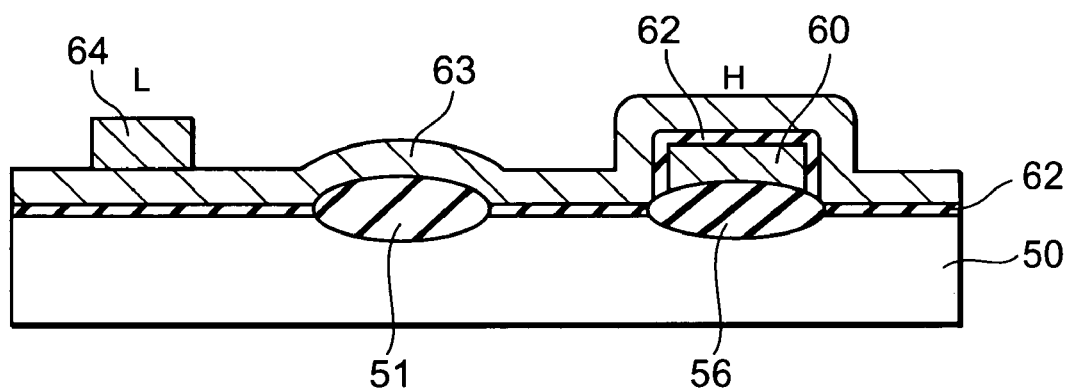
Figure 2H:
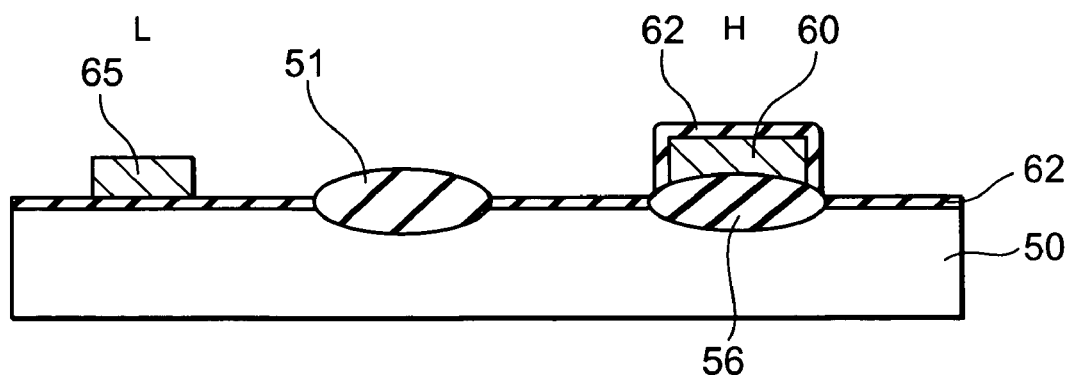

A method of manufacturing a multigate semiconductor device related to the present invention will be described with reference to accompanying drawings. FIG. 4A to FIG. 4J are each a sectional view that shows a process of manufacturing a conventional multigate semiconductor device according to the present invention. In FIG. 4A to FIG. 4J, an element region in which a low-voltage transistor is formed is denoted by the reference character "L" and an element region in which a high-voltage transistor is formed is denoted by the reference character "H."

Figure 4A:
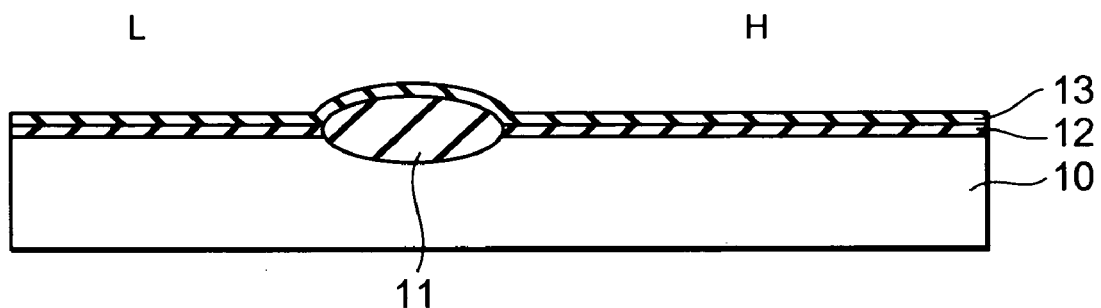
FIGS. 4A to 4J are cross sectional views each showing a method of manufacturing a multigate semiconductor device of a first embodiment according to the present invention.

First, a field oxide film 11 is formed on a semiconductor substrate 10 by a selected oxidation process, whereby element isolation is performed. Subsequently, a dummy oxide film 12 is formed on the whole surface. Furthermore, a nitride film 13 is formed on this dummy oxide film 12. As a result of this, the structure shown in FIG. 4A is obtained.

Figure 4B:
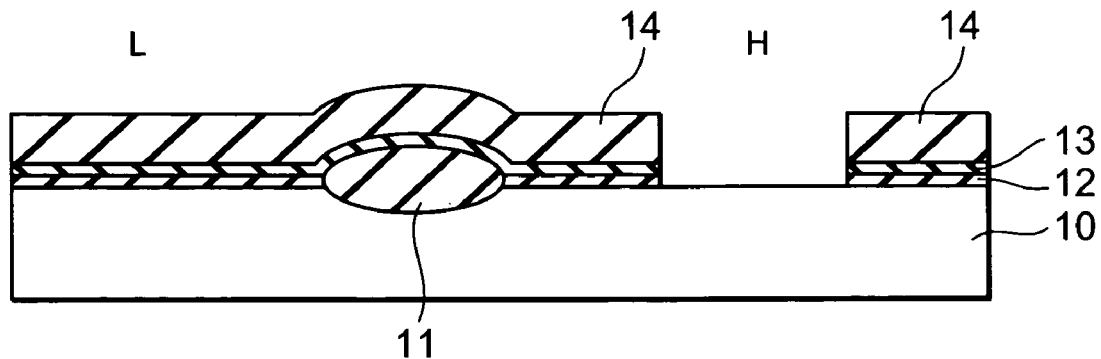

Next, by performing the patterning of a photoresist, a pattern 14 having an opening in a region in which a gate electrode of a high-voltage transistor (an electrode formation region) is formed on the nitride film 13. Subsequently, by performing dry etching in which this pattern 14 is used as a mask, the nitride film 13 and the dummy oxide film 12 in the above-described electrode formation region are removed. As a result of this, the structure shown in FIG. 4B is obtained.

Figure 4C:
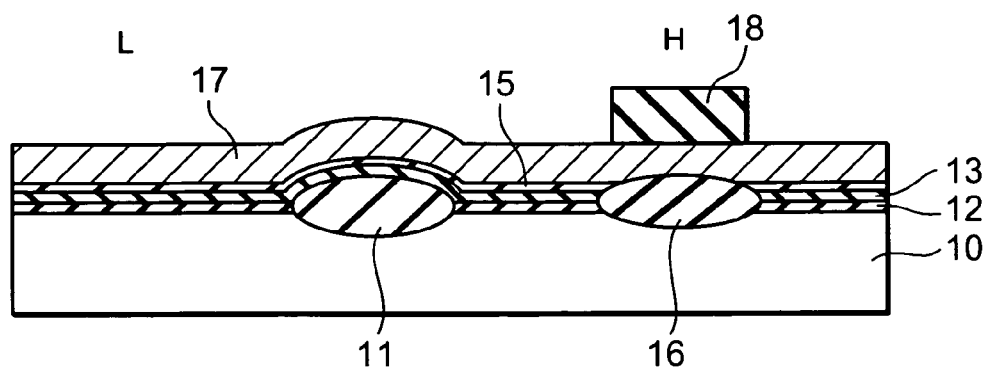

Next, the pattern 14 is removed. Subsequently, by a selective oxidation method in which the nitride film 13 is used as a mask, a gate oxide film 16 of a high-voltage transistor is formed in the above-described electrode formation region. In this step of selective oxidation, a thin oxide film 15 is formed on the nitride film 13. Furthermore, polycrystalline silicon 17 is formed on the whole surface. And by performing the patterning of a photoresist, a pattern 18 is formed in the electrode formation region of a high-voltage transistor. As a result of this, the structure shown in FIG. 4C is obtained.

Figure 4D:
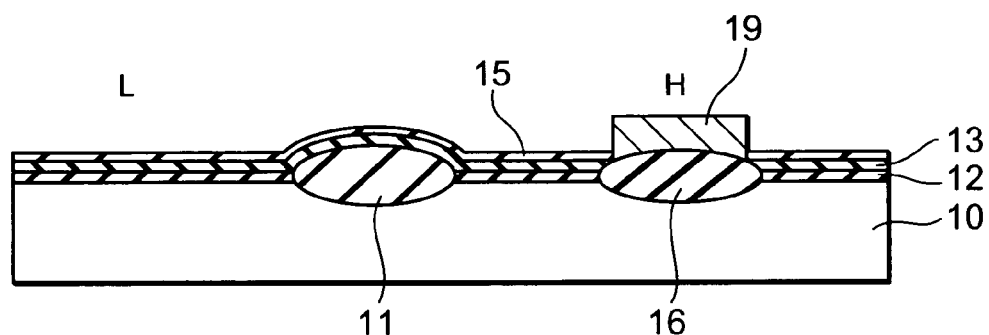

Next, by performing dry etching in which this pattern 18 is used as a mask, the above-described polycrystalline silicon 17 is selectively removed. After that, the pattern 18 is removed. As a result of this, as shown in FIG. 4D, a first electrode 19 of a high-voltage transistor is formed.

Figure 4E:
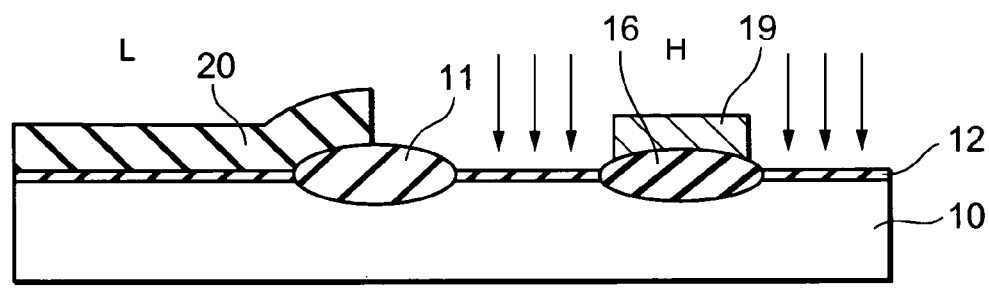

Next, the oxide film 15 is removed by performing wet etching and furthermore, the nitride film 13 is removed by performing dry etching. Subsequently, a pattern 20 which covers an element region L of a low-voltage transistor is formed. As a result of this, the structure shown in FIG. 4E is obtained. And by using this pattern 20 as a mask, impurity ions are implanted through the dummy oxide film 12 into an element region H of a high-voltage transistor. As a result of this, an LDD is formed in the semiconductor substrate 10 of the element region H of a high-voltage transistor.

Figure 4F:
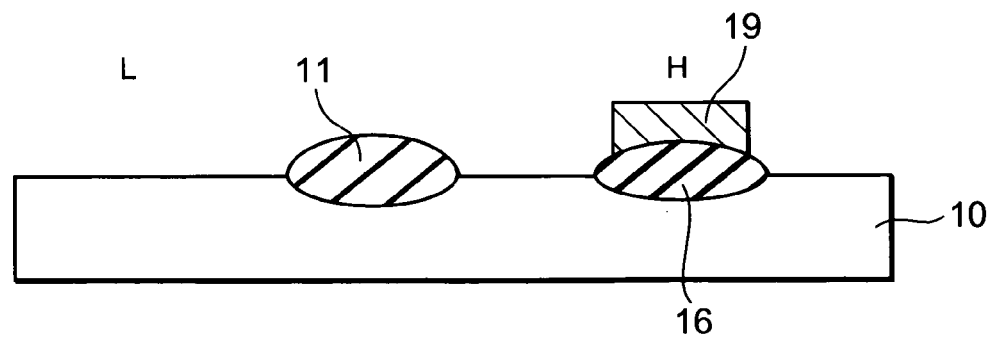

Next, the pattern 20 is removed and the dummy oxide film 12 is removed by performing wet etching. As a result of this, the structure shown in FIG. 4F is obtained.

Figure 4G:
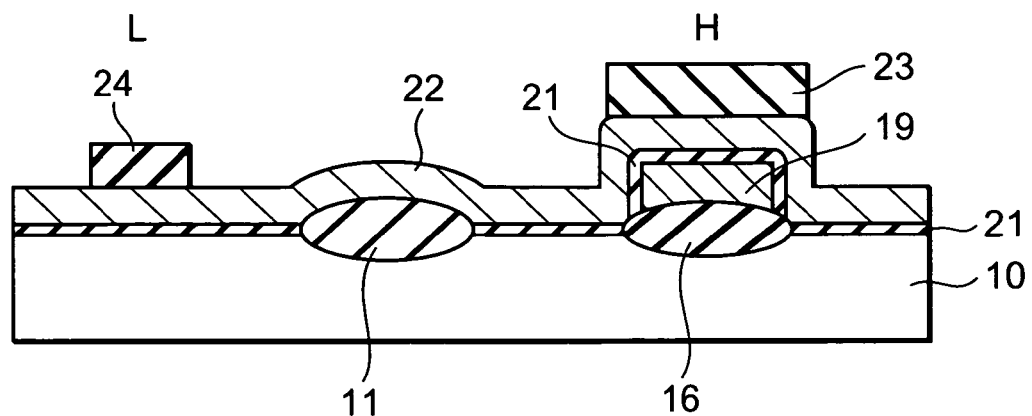

Next, a gate oxide film 21 for a low-voltage transistor is formed on the whole surface. A polycrystalline silicon 22 is further formed on the whole surface. Subsequently by performing the patterning of a photoresist, a pattern 23 and a pattern 24 are formed respectively on the electrode formation region of a high-voltage transistor and the electrode formation region of a low-voltage transistor. As a result of this, the structure shown in FIG. 4G is obtained.

Figure 4H:
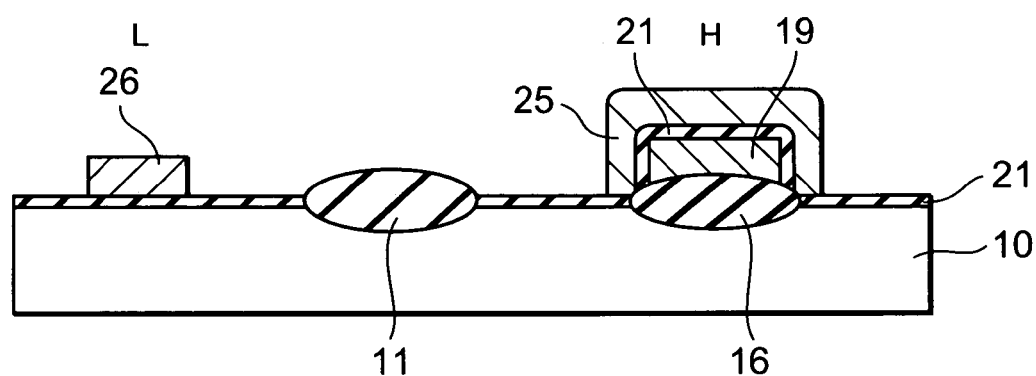

Next by performing dry etching in which these patterns 23, 24 are used as masks, the above-described polycrystalline silicon 23 is selectively removed. After that, the patterns 23, 24 are removed. As a result of this, as shown in FIG. 4H, a second gate electrode 25 of a high-voltage transistor and a gate electrode 26 of a low-voltage transistor are formed.

Figure 4I:
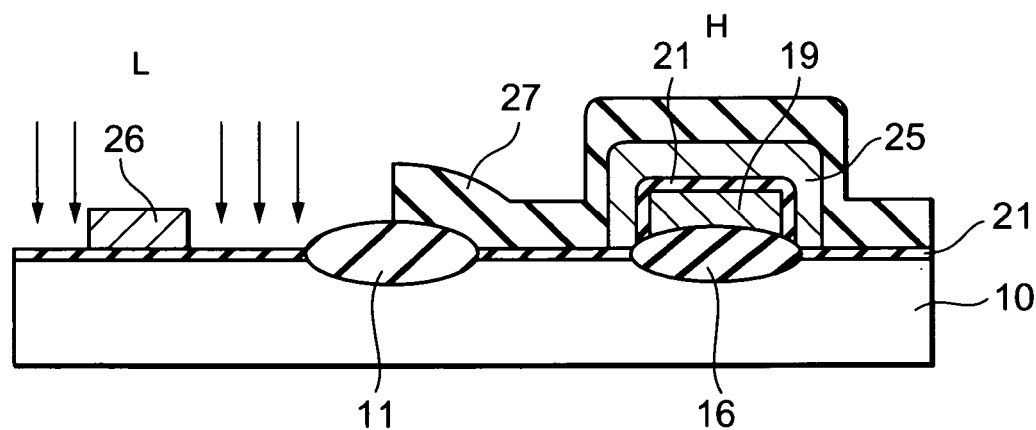
Figure 4J:
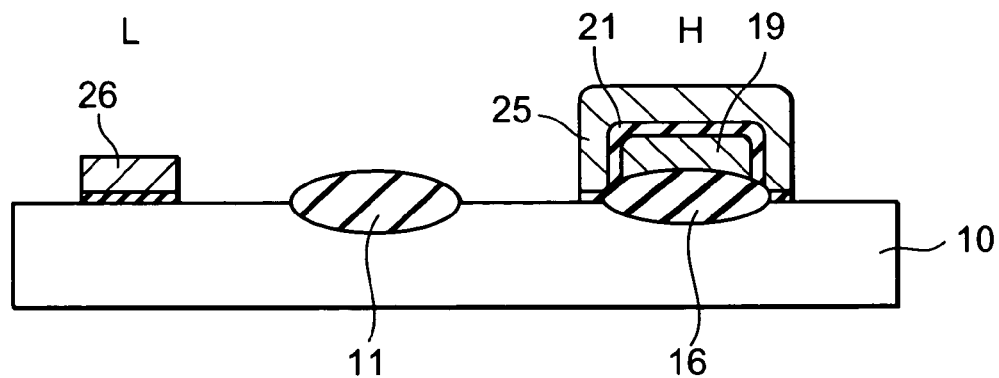

Next, a pattern 27 which covers the element region H of a high-voltage transistor is formed. As a result of this, the structure shown in FIG. 4I is obtained. And by using this pattern 27 as a mask, impurity ions are implanted through the gate oxide film 21 into the element region L of a low-voltage transistor. As a result of this, an LDD is formed in the semiconductor substrate 10 of the element region L of a low-voltage transistor. After that, the pattern 27 is removed.

Next, the above-described LDD portions of a high-voltage transistor and a low-voltage transistor are covered with prescribed patterns (not shown), and impurity ions are implanted into source-drain regions of the low-voltage transistor and high-voltage transistor. Source-drains of the low-voltage transistor and high-voltage transistor are formed by causing the impurities to diffuse thermally. And the gate oxide film 21 is removed by using the above-described second gate electrodes 25 of a high-voltage transistor and the gate electrode 26 of a low-voltage transistor as masks. In this way, a multigate semiconductor device in which a low-voltage MOS transistor and a high-voltage MOS transistor are mounted in a mixed manner on the same substrate is completed.

The advantages of a method of manufacturing a multigate semiconductor device related to the present invention are as follows. That is, after the formation of the gate oxide film 16 of a high-voltage transistor, the polycrystalline silicon 17 is subsequently formed (see FIG. 4C). In the succeeding steps, the exposure of the surface of the gate oxide film 16 of a high-voltage transistor does not occur and the surface is not subjected to etching treatment. Therefore, the film, quality of formed multiple gate oxide films is improved.

Figure 3:
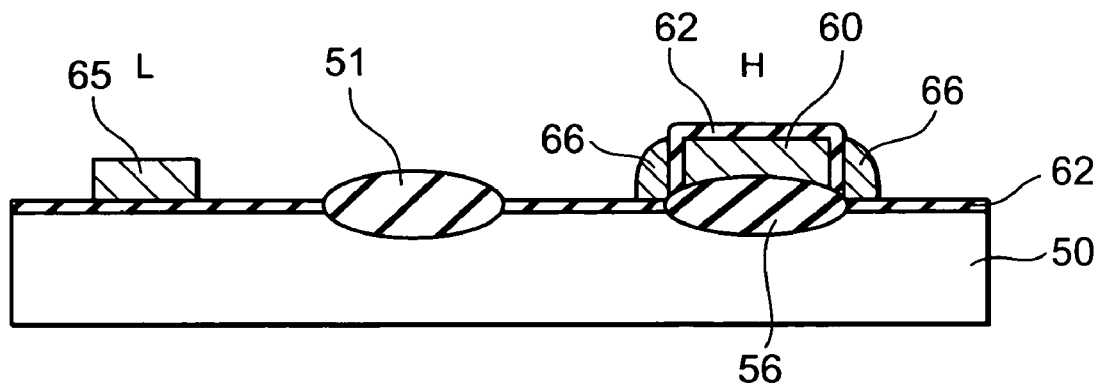
FIG. 3 is a sectional view that shows a method of manufacturing a further related multigate semiconductor device.

Furthermore, as shown in FIG. 4G, when the gate electrode 26 of a low-voltage transistor is formed, a pattern is formed not only in the electrode formation region of a low-voltage transistor, but also in the electrode formation region of a high-voltage transistor. As a result of this, the polycrystalline silicon 22 which covers the first gate electrode 19 of a high-voltage transistor is not removed and becomes the second electrode 25 as shown in FIG. 4H. Therefore, the formation of residual polycrystalline silicon as shown in FIG. 3 is prevented, and furthermore, the occurrence of waste from the residual polycrystalline silicon is prevented. Thus, according to a method of manufacturing a multigate semiconductor device related to the present invention, yields are improved.

A multigate semiconductor device related to the present invention is provided with gate electrodes having a three-layer structure formed from polycrystalline silicon/oxide film/polycrystalline silicon. That is, as shown in FIG. 4H, in the element region H of a high-voltage transistor, the second gate electrode 25 is formed via the oxide film 21 to cover the first gate electrode 19. As described above, such a multigate semiconductor device does not have residual polycrystalline silicon, which becomes a source of scrap, and hence this multigate semiconductor device has high quality.

Figure 5A:
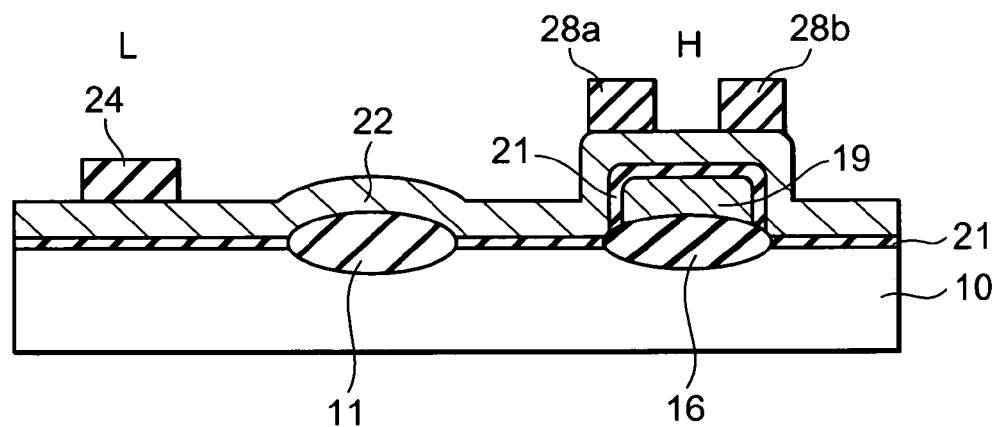
FIGS. 5A to 5B are cross sectional views each showing a method of manufacturing a multigate semiconductor device of a second embodiment according to the present invention.
Figure 5B:
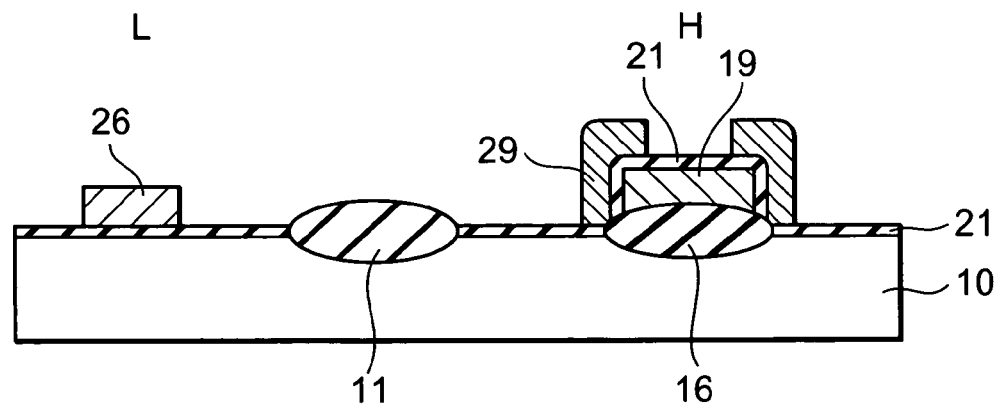

In order to ensure connection between the gate electrodes (19, 25) formed in a high-voltage transistor and interconnections, it is necessary to form a contact portion. FIGS. 5A and 5B are each a sectional view that shows a method of manufacturing a multigate semiconductor device according to the present invention. In FIGS. 5A and 5B, like parts are identified by the same reference numerals as in FIG. 4A to FIG. 4J and their descriptions are omitted as required. Also, in terms of process flow, the stages shown in FIGS. 5A and 5B are respectively the same stages as shown in FIG. 4G and FIG. 4H.

After the formation of the structure shown in FIG. 4F, a gate oxide film 21 for a low-voltage transistor is formed on the whole surface. Furthermore, polycrystalline silicon 22 is formed on the whole surface. Subsequently, by performing the patterning of a photoresist, a pattern 24 and a pattern 28 are formed respectively on an electrode formation region for a low-voltage transistor and an electrode formation region for a high-voltage transistor. As shown in FIG. 5A, this pattern 28 includes a pattern 28a and a pattern 28b, and an opening is formed between the pattern 28a and the pattern 28b. That is, in the electrode formation region of a high-voltage transistor, the pattern 28 is formed to cover part of the polycrystalline silicon 22. And in this electrode formation region, the other part of the polycrystalline silicon 22 is exposed.

Next, by performing dry etching in which these patterns 24, 28a, 28b are used as masks, the above-described polycrystalline silicon 22 is selectively removed. On that occasion, in the electrode formation region of a high-voltage transistor, the polycrystalline silicon 22 in a position corresponding to the above-described opening is also removed. After that, the patterns 24, 28a, 28b are removed. As a result of this, as shown in FIG. 5B, a gate electrode 26 of a low-voltage transistor and a second gate electrode 29 of a high-voltage transistor are formed. This second gate electrode 29 of a high-voltage transistor is a through portion in which a contact portion is formed. This through portion reaches the gate oxide film 21 in the electrode formation region of a high-voltage transistor.

As described above, according to a method of manufacturing a multigate semiconductor device related to the present invention, the film quality of formed multiple gate oxide films is improved and yields are improved. Also, a multigate semiconductor device related to the present invention has high quality.

What is claimed is:

1. A method of manufacturing a semiconductor device, comprising:
    forming a first insulating film having a first thickness in a first region on a semiconductor substrate;
    forming a first gate electrode on said first insulating film;
    forming a second insulating film having a second thickness different from said first thickness on said semiconductor substrate and said first gate electrode;
    forming a conductive film on said second insulating film;
    forming a first resist pattern and a second resist pattern respectively on said conductive film in said first region excluding a central part of said first gate electrode and on said conductive film of a second region different from said first region;
    removing said conductive film by using the first resist pattern as a mask to form a second gate electrode covering said first gate electrode via said second insulating film; and
    removing said conductive film by using the second resist pattern as a mask to form a third gate electrode on said second insulating film of said second region.

2. The method as claimed in claim 1, wherein said first thickness is larger than said second thickness.

3. The method as claimed in claim 2, wherein said first insulating film is an oxide film.

4. The method as claimed in claim 3, wherein said second insulating film is an oxide film.

5. The method as claimed in claim 4, wherein said conductive film is a polysilicon film.

6. The method as claimed in claim 1 wherein said first resist pattern is formed to have a width larger than a width of said first gate electrode.

7. The method as claimed in claim 6, wherein said first resist pattern is formed to have an opening which is located over said first gate electrode and said conductive film exposed by said opening is removed.

8. A method of forming a semiconductor device, comprising:
    forming an element separation region on a semiconductor substrate to define a first region and a second region on said semiconductor substrate;
    selectively forming a first oxide film on said first region of said semiconductor substrate by a selective oxidation process and a first gate electrode on said first oxide film;
    introducing impurities in said first region;
    forming a second oxide film on said semiconductor substrate and surfaces of said gate electrode of said first region and on said semiconductor substrate of said second region;
    forming a conductive film on said second oxide film of said first and second regions;
    selectively removing said conductive film to form a second gate electrode on said second region and form a cover film to cover said first electrode excluding a central part thereof via said second oxide film;
    introducing impurities in said second region; and
    removing said second oxide film to form a gate oxide film for said second gate electrode.

9. The method as claimed in claim 1, wherein the center part of said first gate electrode is a penetration part where the contact part of said first gate electrode is formed.

10. The method as claimed in claim 8, wherein the center part of said first gate electrode is a penetration part where the contact part of said first gate electrode is formed.

* * * * *

UNITED STATES PATENT AND TRADEMARK OFFICE
CERTIFICATE OF CORRECTION

PATENT NO. : 7,129,137 B2
APPLICATION NO. : 11/138481
DATED : October 31, 2006
INVENTOR(S) : Hiroki Matsumoto It is certified that error appears in the above-identified patent and that said Letters Patent is hereby corrected as shown below:

On the title page, item [73]:
Assignee: delete "NEC Corporation, Kanagawa (JP)" and
insert --NEC ELECTRONICS CORPORATION, Kanagawa (JP)--

Signed and Sealed this

Eleventh Day of March, 2008

JON W. DUDAS
*Director of the United States Patent and Trademark Office*